United States Patent
Videtich et al.

(10) Patent No.: US 7,162,215 B2
(45) Date of Patent: *Jan. 9, 2007

(54) METHOD AND SYSTEM FOR SETTING USER PREFERENCE SATELLITE RADIO MUSIC SELECTIONS IN A MOBILE VEHICLE

(75) Inventors: Matt C. Videtich, Farmington Hills, MI (US); Thomas P. Grau, Rochester Hills, MI (US); Richard M. Lee, Bloomfield Village, MI (US)

(73) Assignee: General Motors Corporation, Detroit, MI (US)

( * ) Notice: Subject to any disclaimer, the term of this patent is extended or adjusted under 35 U.S.C. 154(b) by 459 days.

This patent is subject to a terminal disclaimer.

(21) Appl. No.: 10/121,460

(22) Filed: Apr. 12, 2002

(65) Prior Publication Data

US 2003/0194977 A1 Oct. 16, 2003

(51) Int. Cl.
*H04B 1/18* (2006.01)

(52) U.S. Cl. .............................. 455/186.2; 455/161.3; 455/420

(58) Field of Classification Search ................ 455/12.1, 455/185.1, 186.1, 186.2, 418, 419, 420, 161.2, 455/161.3, 161.1, 150.1, 179.1
See application file for complete search history.

(56) References Cited

U.S. PATENT DOCUMENTS

| | | | | |
|---|---|---|---|---|
| 3,919,479 A | * | 11/1975 | Moon et al. | 704/237 |
| 5,422,681 A | * | 6/1995 | Hayashi | 348/730 |
| 5,973,750 A | * | 10/1999 | Ogawa et al. | 348/570 |
| 6,011,854 A | * | 1/2000 | Van Ryzin | 381/77 |
| 6,025,868 A | | 2/2000 | Russo | |
| 6,181,921 B1 | * | 1/2001 | Konisi et al. | 455/186.2 |
| 6,314,094 B1 | * | 11/2001 | Boys | 370/352 |
| 6,950,638 B1 | * | 9/2005 | Videtich et al. | 455/186.1 |
| 6,978,152 B1 | * | 12/2005 | Yamaashi et al. | 455/526 |
| 2001/0037210 A1 | * | 11/2001 | Hirayama | 705/1 |
| 2001/0037378 A1 | * | 11/2001 | Hirayama | 709/219 |
| 2002/0083454 A1 | | 6/2002 | Braxton | |
| 2003/0032399 A1 | * | 2/2003 | Slupe | 455/161.2 |
| 2003/0032400 A1 | * | 2/2003 | Tsubaki et al. | 455/186.1 |
| 2003/0060219 A1 | * | 3/2003 | Parsiokas | 455/501 |
| 2004/0203340 A1 | * | 10/2004 | Oesterling | 455/9 |
| 2005/0009466 A1 | | 1/2005 | Kamdar et al. | |

* cited by examiner

*Primary Examiner*—Edward F. Urban
*Assistant Examiner*—Nhan T. Le
(74) *Attorney, Agent, or Firm*—Anthony Luke Simon

(57) ABSTRACT

A system and method is directed to setting user preference satellite radio music selections in a mobile vehicle. The method provides creating at least one vehicle preference selection list utilizing a user interface, transferring the vehicle preference selection list into a mobile communication unit, monitoring a satellite radio system broadcast, requesting the vehicle preference selection list from the mobile communication unit, and extracting a selection from the broadcast based on the vehicle preference selection list. The system provides a means for creating a vehicle preference selection list utilizing a user interface, a means for transferring the vehicle preference selection list into a mobile communication unit, a means for monitoring a satellite radio system broadcast, a means for requesting the vehicle preference selection list from the mobile communication unit, and a means for extracting a selection from the broadcast based on the vehicle preference selection list.

20 Claims, 4 Drawing Sheets

FIG. 2a
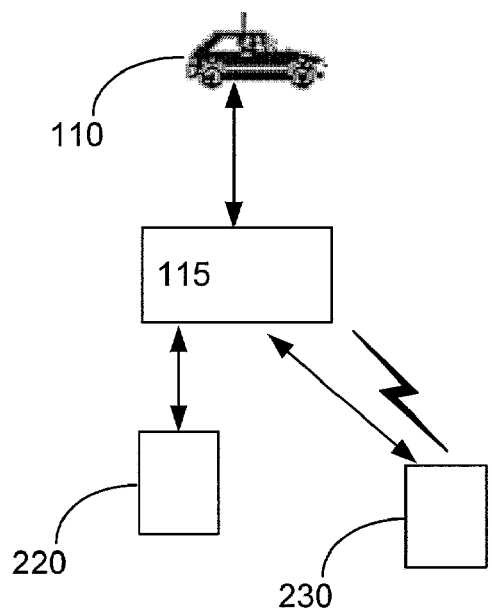
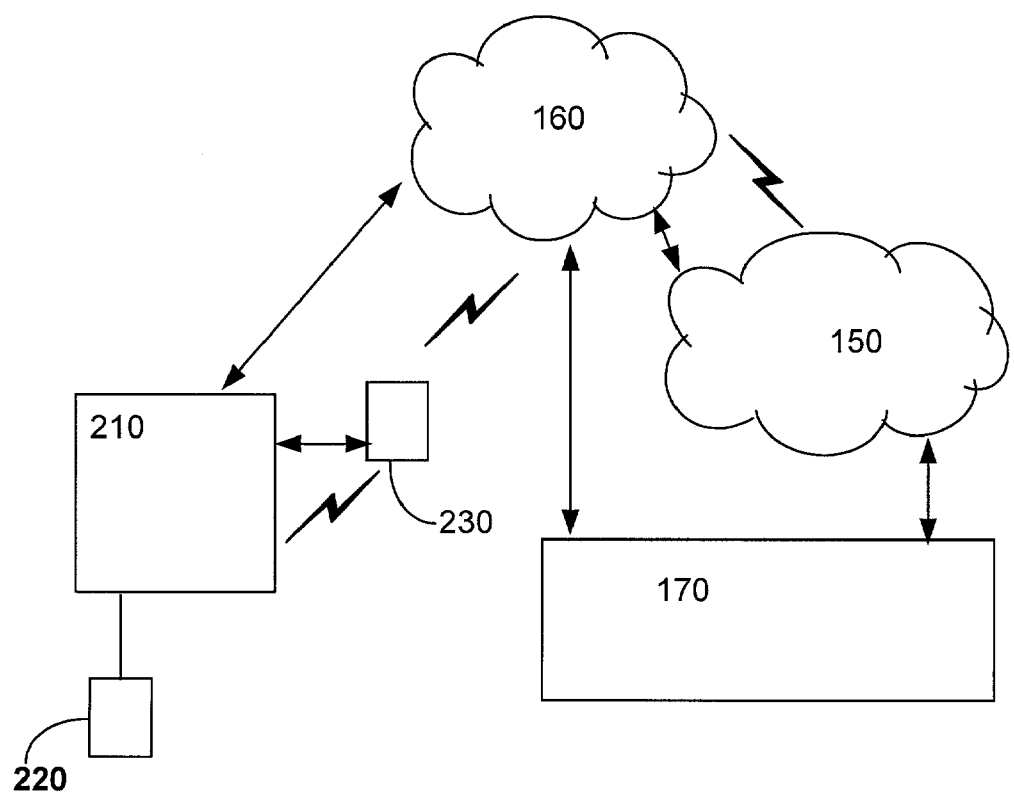
FIG. 2

METHOD AND SYSTEM FOR SETTING USER PREFERENCE SATELLITE RADIO MUSIC SELECTIONS IN A MOBILE VEHICLE

FIELD OF THE INVENTION

In general, the invention relates to data transmission over a wireless communication system. More specifically, the invention relates to a method and system for setting user preference satellite radio music selections in a mobile vehicle.

BACKGROUND OF THE INVENTION

Mobile communication units (MCU's), such as cellular phones, personal data assistants (PDA's), Global Positioning System (GPS) devices, and on-board Vehicle Communication Units (VCU's), used in conjunction with a Wide Area Network (WAN), such as a cellular telephone network or a satellite communication system, have made it possible for a person to send and receive voice communications, data transmissions, and FAX messages from virtually anywhere on earth. Such communication is initiated at the MCU when it is turned on, or by entering a phone number to be called, or in many cases, by pressing a preprogrammed button on the MCU or speaking a voice command causing the MCU to automatically complete the process of dialing the number to be called. A radio communication link is established between the MCU and a Wide Area Network (WAN), using a node of the WAN in the vicinity of the MCU.

In cellular telephone systems, a node is commonly referred to as a "cellular base station." Once the radio communication link between the MCU and the cellular base station has been established, the base station then utilizes a combination of additional cellular stations, conventional telephone wire line networks, and possibly even satellite systems to connect the MCU to the number to be called.

Wireless communication services for MCU users, such as navigation and roadside assistance, have increased rapidly in recent years. Most of the services that have been offered are for a motor vehicle in operation, and include services that may require location and destination information. Such services are provided at a cost to the MCU user, and also at a cost to the MCU service provider. MCU service providers must make available a wireless communication service customer assistance center (or other such manually staffed service center) in order that an operator or customer assistant may complete the MCU requests. It would be beneficial to the MCU user and service provider to offer information and services advantageous to the MCU user, yet profitable to the MCU provider without MCU user subsidies. In addition, limited MCU equipped vehicle information is currently requested or used for the immediate advantage of the MCU user. Also, the current MCU equipped vehicle information is of little use to MCU providers or any other third party concern.

Recently, additional services have been offered for entertainment purposes, such as satellite radio, terrestrial digital radio, and other wireless communication systems to motor vehicles. Many of these broadcasts may be delivered with additional data such as station identification, song titles, and program schedules. Such services are also provided at a cost to the user and will provide an additional revenue stream if enhancements can be linked to an MCU system. MCU service providers may utilize the already available WAN to provide such enhancements.

It would be desirable, therefore, to provide a method and system that would overcome these and other disadvantages.

SUMMARY OF THE INVENTION

The present invention is directed to a system and method for setting user preference satellite radio music selections in a mobile vehicle. The invention allows a user to establish a vehicle preference selection list utilizing a user interface, download the vehicle preference selection list into a vehicle mounted satellite radio receiver, and have the option of listening to either the vehicle preference selection list or a user determined station.

One aspect of the invention provides a method for setting user preference satellite radio music selections in a mobile vehicle by creating at least one vehicle preference selection list utilizing a user interface, transferring the vehicle preference selection list into a mobile communication unit, monitoring a satellite radio system broadcast, requesting the vehicle preference selection list from the mobile communication unit, and extracting a selection from the broadcast based on the vehicle preference selection list. The invention further provides for extracting the selection by comparing user prioritized music selections in the vehicle preference selection list to a plurality of radio station music selections from the broadcast.

According to another feature of the invention, the method further provides for switching between the vehicle preference selection list and a user defined radio station preference setting in response to user input. The method further provides for creating the at least one vehicle preference selection list utilizing the user interface including a user communicating with a provider of the broadcast over an internet connection.

In accordance with an aspect of the invention, a system for vehicle preference selection monitoring is provided. The system includes a means for creating a vehicle preference selection list utilizing a user interface. The system further includes means for transferring the vehicle preference selection list into a mobile communication unit. Means for monitoring a satellite radio system broadcast, means for requesting the vehicle preference selection list from the mobile communication unit and means for extracting a selection from the broadcast based on the vehicle preference selection list are also provided.

In accordance with another aspect of the invention, a computer readable medium storing a computer program includes: computer readable code for creating a vehicle preference selection list utilizing a user interface, computer readable code for transferring the vehicle preference selection list into a mobile communication unit, computer readable code for monitoring a satellite radio system broadcast, computer readable code for requesting the vehicle preference selection list from the mobile communication unit, and computer readable code for extracting a selection from the broadcast based on the vehicle preference selection list.

The foregoing and other features and advantages of the invention will become further apparent from the following detailed description of the presently preferred embodiment, read in conjunction with the accompanying drawings. The detailed description and drawings are merely illustrative of the invention rather than limiting, the scope of the invention being defined by the appended claims and equivalents thereof.

BRIEF DESCRIPTION OF THE DRAWINGS

FIG. 2 is a block diagram illustrating an embodiment of the present invention;

FIG. 2a is a block diagram illustrating another embodiment of the present invention;

DETAILED DESCRIPTION OF THE PRESENTLY PREFERRED EMBODIMENT

Throughout the specification, and in the claims, the term "connected" means a direct electrical connection between the things that are connected, without any intermediate devices. The term "coupled" means either a direct electrical connection between the things that are connected, or an indirect connection through one or more passive or active intermediary devices.

The present invention relates to data transmission over a wireless communication system and more particularly to setting user preference satellite radio music selections in a mobile vehicle. The present invention allows a user to establish a vehicle preference selection list utilizing a user interface, download the vehicle preference selection list into a vehicle mounted satellite radio receiver, and have the option of listening to either the vehicle preference selection list or a user determined station.

ILLUSTRATIVE OPERATING ENVIRONMENT

Figure 1:
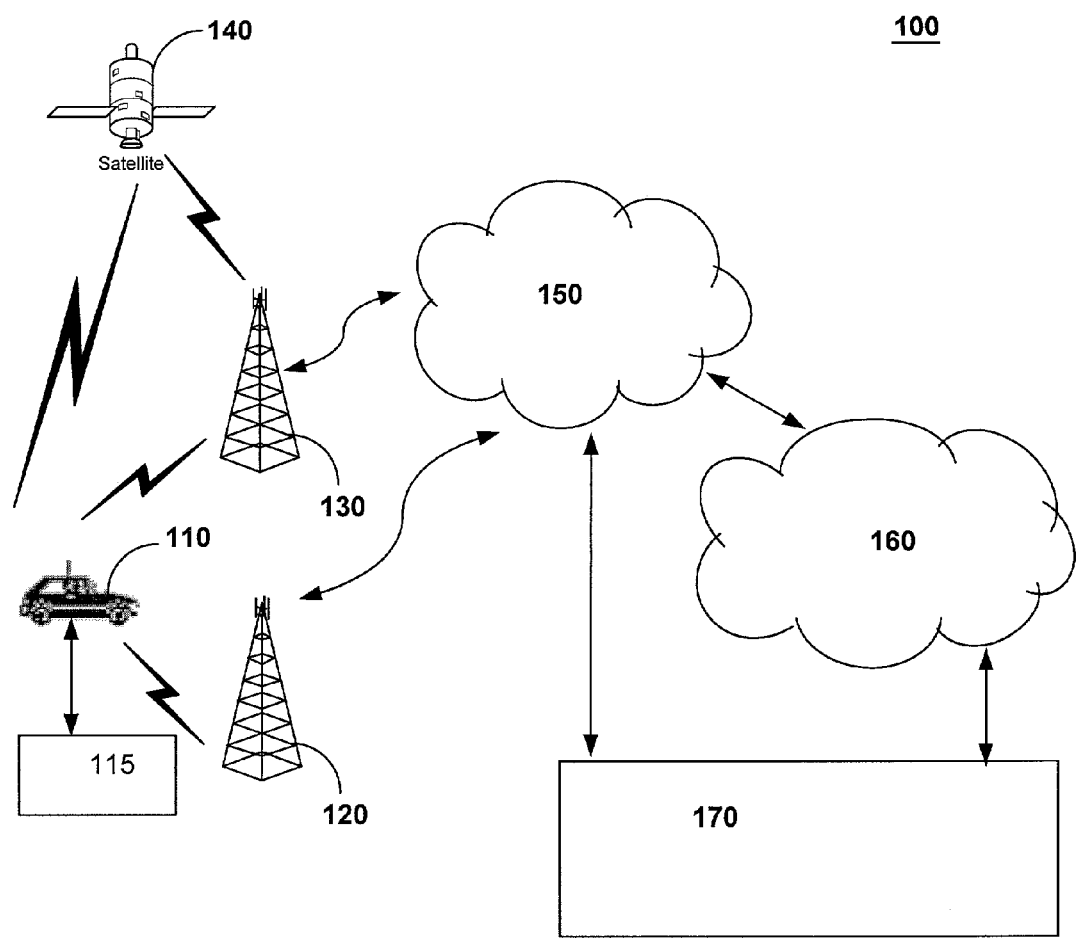
FIG. 1 is a block diagram illustrating an operating environment according to an embodiment of the present invention.

FIG. 1 is a block diagram illustrating an example of an operating environment that is in accordance with the present invention. FIG. 1 details an embodiment of a system for operating a satellite radio music subscription service in a mobile vehicle, in accordance with the present invention, and may be referred to as a mobile vehicle communication system (MVCS) 100. The mobile vehicle communication system (MCVS) 100 may include one or more mobile vehicle communication units (MVCU) 110, one or more audio devices 115, one or more wireless communication systems 120, one or more radio carrier systems 130, one or more satellite broadcast systems 140, one or more communication networks 150, one or more land networks 160, and one or more service providers 170.

MCVU 110 may contain a wireless vehicle communication device (module, MVCS module) such as an analog or digital phone with suitable hardware and software for transmitting and receiving data communications. MCVU 110 may contain a wireless modem for transmitting and receiving data. MCVU 110 may contain a digital signal processor with software and additional hardware to enable communications with the mobile vehicle and to perform other routines and requested services. MCVU 110 may contain a global positioning system (GPS) unit capable of determining synchronized time and a geophysical location of the mobile vehicle. MCVU 110 may send to and receive radio transmissions from wireless communication system 120.

Audio device 115 may include any suitable hardware for receiving broadcast signals in MCVU 110. Audio device 115 includes a receiver and may receive broadcasts from wireless communication system 120, radio broadcast system 130, and satellite broadcast system 140. Audio device 115 may further include an audio speaker, a synthesized voice output, an audio channel, or the like. Audio device 115 may be implemented, in addition to the receiver, as a set of headphones, the audio portion of a television, a display device, or the like.

MCVU 110 may also contain a speech recognition system (ASR) module capable of communicating with audio device 115. The module may additionally be capable of functioning as any part or all of the above communication devices and, for one embodiment of the invention, may be capable of data storage, and/or data retrieval, and/or receiving, processing, and transmitting data queries. In one example, audio device 115 includes a speech recognition system (ASR) module.

Wireless communications system 120 may be a wireless communications carrier or a mobile telephone system and may transmit to and receive signals from one or more MCVU 110. Wireless communication system 120 may incorporate any type of telecommunications in which electromagnetic waves carry signal over part or the entire communication path. More specific to the present invention, wireless communication system 120 may be any type of broadcast communication in addition to those of radio broadcast system 130 and satellite broadcast system 140. Wireless communications system 120 may be implemented as a single unit in conjunction with radio broadcast system 130, it may be implemented as coupled with radio broadcast system 130, or in some such other configuration as would allow the systems to function as described.

In one example, such wireless communication carrier is a short message service, modeled after established protocols such as IS-637 SMS standards, IS-136 air interface standards for SMS, and GSM 03.40 and 09.02 standards. Similar to paging, an SMS communication could be broadcast to a number of regional recipients.

In another example, the mobile telephone system may be an analog mobile telephone system operating over a prescribed band nominally at 800 MHz. The mobile telephone system may be a digital mobile telephone system operating over a prescribed band nominally at 800 MHz, 900 MHz, 1900 MHz, or any suitable band capable of carrying mobile communications.

Radio broadcast system 130 may transmit radio signals with data to audio device 115 in MCVU 110. Radio broadcast system 130 may transmit analog audio and/or video signals, such as those sent from AM and FM radio stations and transmitters, or digital audio signals in the S band (approved for use in the U.S.) and L band (used in Europe and Canada). Audio device 115 may store or retrieve data and information from the audio and/or video signals of radio broadcast system 130. In one example, audio device 115 retrieves terrestrial digital radio signals from a signal received from radio broadcast system 130.

Satellite broadcast system 140 may transmit radio signals to audio device 115 in MCVU 110. In one embodiment, satellite broadcast system 140 may broadcast over a spectrum in the "S" band (2.3 GHz) that has been allocated by the U.S. Federal Communications Commission (FCC) for nationwide broadcasting of satellite-based Digital Audio Radio Service (DARS).

Broadcast services provided by radio broadcast system 130 and satellite broadcast system 140 may be received by audio device 115 in MCVU 110. Broadcast services may include various different formatted programs based on a package subscription obtained by the user and managed by the audio device 115. Formatted programs may include such formats as "Talk," various music genres, targeted regional information, and the like.

Communications network 150 may be implemented as any suitable system or collection of systems for connecting wireless communications system 120 to at least one MCVU 110 or to a service provider 170. Communications network 150 may include a mobile switching center and may provide services from one or more wireless communications companies.

Land network 160 may connect communications network 150 to service provider 170. Land network 160 may be implemented as a public-switched telephone network, a wired network, an optical network, a fiber network, another wireless network, or any combination thereof. Land network 160 may comprise an Internet protocol (IP) network. In one embodiment, an MCVU 160 may utilize all or part of the wireless communications system 120, communications network 150, and land network 160.

Land network 160 may connect one or more communications systems 120 to one another. Communication network 150 and land network 160 may connect wireless communications system 120 to a communication node or service provider 170.

Service provider 170 may be implemented as one or more locations where communications may be received or originate to facilitate functioning of the mobile vehicle communication system (MCVS) 100. Service provider 170 may contain any of the previously described functions.

In one embodiment, service provider 170 may be implemented as a call center, In yet another example, the call center may be implemented to service one or more of the above examples, or other services.

In operation, a service provider 170 may utilize one or more portions of the aforementioned communications network to communicate subscriber requested programming to audio device 115. The subscriber requested programming may then be accessed to by audio device 115 utilizing one or more radio broadcast system 130 and satellite broadcast system 140 segments.

FIGS. 2 and 2a are block diagrams illustrating an embodiment of the present invention. FIGS. 2 and 2a detail an embodiment of a system for setting and receiving user preference satellite radio music selections in a mobile vehicle, in accordance with the present invention, and may be referred to as a user preference satellite reception system (UPSRS). Like components from FIG. 1 and FIGS. 2 and 2a are labeled identically.

In one example, a UPSRS may be implemented as part of wireless communications system, and as part of an satellite radio and terrestrial digital radio communications system.

The user preference satellite reception system (UPSRS) of FIGS. 2 and 2a may further include one or more user interfaces 210. User interfaces 210 may be implemented to allow a user to communicate with service provider 170 via one or more communication networks 150 and/or land networks 160. In one embodiment, user interfaces 210 would include an ability to send as well as receive and store information. In one example, user interfaces 210 may be implemented as a personal computer or other device allowing communication with service provider 170.

In one embodiment, user interface 210 provides the user access to the service provider 170 where, among other options, the user may compile a list of preferred or non-preferred music selections from a subscription service.

In another embodiment, one or more personal data assistants 230 may be utilized to access service provider 170. In an example, personal data assistant 230 may access service provider 170 indirectly via interfacing with user interfaces 210.

In another example, personal data assistant 230 may access service provider 170 directly via wireless communication utilizing one or more communication networks 150 and/or land networks 160. Examples of such wireless personal data assistants 230 include the Palm Pilot, RIM Blackberry, and the like.

In one embodiment, personal data assistant 230 may allow storage of data received from service provider 170. In another embodiment, personal data assistant 230 may allow data transfer to audio device 115.

In yet another embodiment, information received by user interfaces 210 from service provider 170 is stored in a mobile memory device 220 for later transfer to audio device 115. In one example, mobile memory device 220 may be implemented as one or more keychain memory devices. Examples of such keychain memory devices include DiskOnKey from M-Systems, ThumbDrive from Trek2000, and the like.

In one embodiment, mobile memory device 220 may allow storage of data received from service provider 170. In another embodiment, mobile memory device 220 may allow data transfer to audio device 115.

EXEMPLARY LIST CREATION

Figure 3:
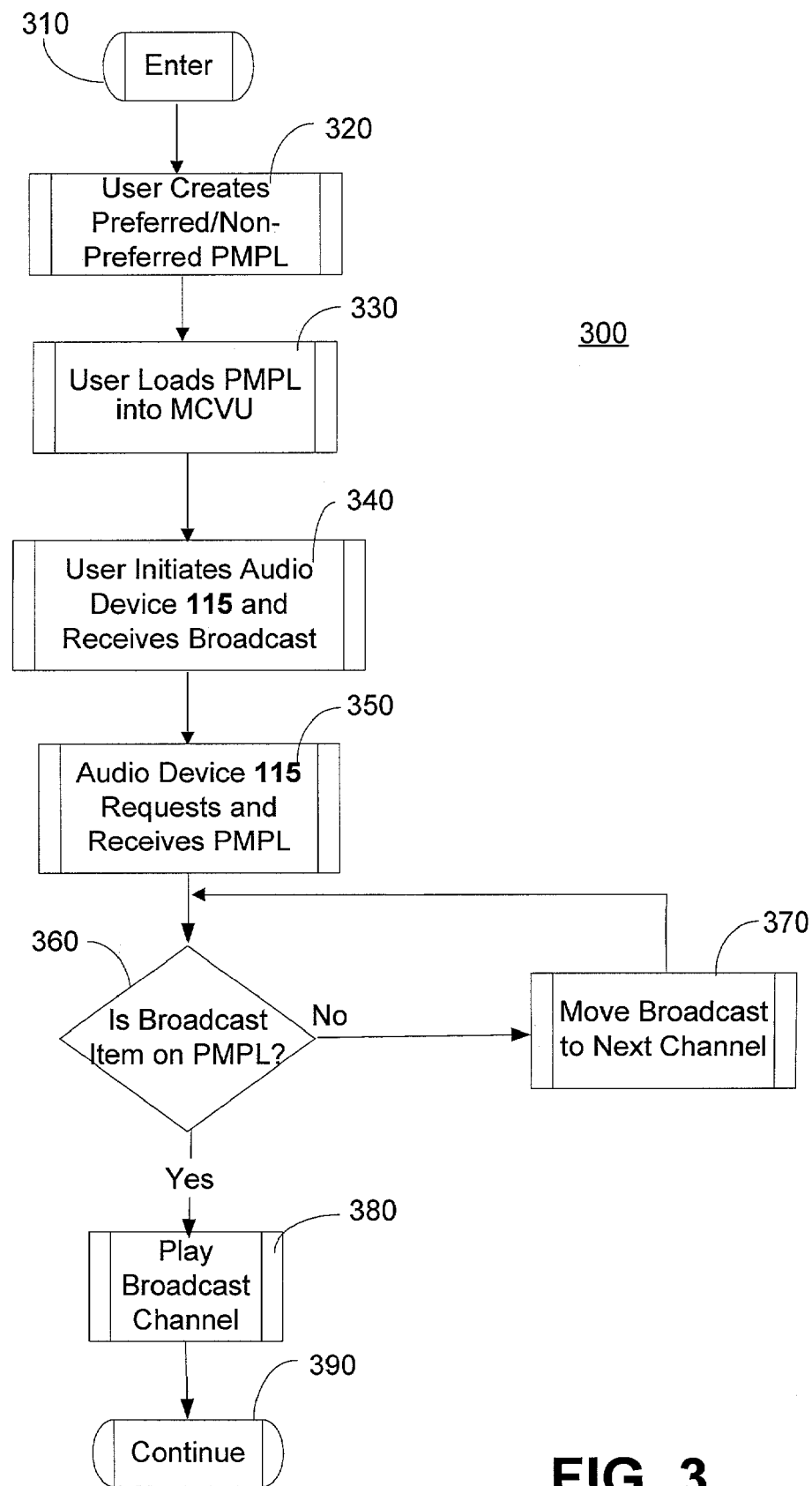
FIG. 3 is a block diagram depicting an exemplary embodiment of code on a computer readable medium in accordance with the present invention.

FIG. 3 is a block diagram depicting an exemplary embodiment of code on a computer readable medium in accordance with the present invention. FIG. 3 details an embodiment of a method 300 for setting and receiving user preference satellite radio music selections in a mobile vehicle, in accordance with the present invention. Method 300 may utilize one or more systems detailed in FIG. 1 and FIGS. 2 and 2a above.

Method 300 begins at block 310 where a user may determine a need to create and utilize either a preferred or a non-preferred personal music programming list (PMPL). In one embodiment, the PMPL may be implemented in a user preference satellite reception system (UPSRS) and referenced as a vehicle preference selection list (VPSL). Method 300 then advances to the next block.

At block 320, the user creates either a preferred or non-preferred PMPL. In one embodiment, the PMPL may be selected by one or more criteria, for example, artist information, song information, album information, and the like. In another embodiment, the PMPL may include prioritized items. The user may create one or more preferred or non-preferred PMPL's. Additionally, the user may create a list including items from both preferred and non-preferred categories as well.

In one embodiment, the user accesses a service provider 170 utilizing a user interface 210, via a combination of one or more communication networks 150 and/or land networks 160, to create the PMPL. In an example, the user may access the service provider 170 utilizing a personal computer via the Internet. In another example, the user may access the service provider 170 utilizing a personal data assistant 230. The user may then create and archive the PMPL.

In one embodiment, the PMPL may be archived at the user interface 210. In an example, the PMPL may be archived in a hard drive located within the interface 210. In another example, the PMPL may be archived in mobile memory device 220. In yet another example, the PMPL may be archived in a personal data assistant 230. The method then advances to block 330.

At block 330, the user transfers the archived PMPL to audio device 115 located within a mobile vehicle communication unit (MVCU) 110. The user may transfer one or more preferred or non-preferred PMPL's. In one embodiment, a mobile memory device 220 may be utilized to transfer the PMPL to audio device 115. In one example, the transfer may be completed via direct connection between mobile memory device 220 and audio device 115.

In another embodiment, a personal data assistant 230 may be utilized to transfer the PMPL to audio device 115. In one example, the transfer may be completed via direct connection between personal data assistant 230 and audio device 115. In another example, the transfer may be completed via wireless communication between personal data assistant 230 and audio device 115. The method then advances to block 340.

At block 340, the user initiates audio device 115. Initiating audio device 115 allows the device to begin receiving a broadcast stream utilizing one or more radio broadcast systems 130 and satellite broadcast systems 140 as described above. The method then advances to block 350.

At block 350, audio device 115 requests and receives the PMPL. In one embodiment, the PMPL is a user provided PMPL. In another embodiment, the PMPL is a previously provided PMPL. In yet another embodiment, the user may choose between one or more currently provided or previously provided PMPL's. The method then advances to decision block 360.

At decision block 360, audio device 115 compares user prioritized music selections in the PMPL to a plurality of radio station music selections from the broadcast. In one embodiment, data identifying the next item in a broadcast stream is included momentarily prior to the beginning of the next item. This data may be utilized by audio device 115 for comparing to an active PMPL and may result in the extraction of a user desired music selection from the broadcast.

In one embodiment, if the selection from the broadcast matches the PMPL the method may advance to block 380, if the PMPL is a preferred list. If the PMPL is a non-preferred list, the match may result in the method advancing to block 370. In the same embodiment, if the selection from the broadcast does not match the PMPL the method may advance to block 370, if the PMPL is a preferred list. If the PMPL is a non-preferred list, the method may advance to block 380.

In another embodiment, method 300 includes a PMPL having both preferred and non-preferred items. In an example, at decision block 360 audio device 115 may utilize the preferred portion of the PMPL to identify a broadcast channel and, barring a match, then utilize the non-preferred portion.

In another embodiment, failure of a match from either type of PMPL may result in audio device 115 maintaining the current broadcast setting, or some such other programming requirement.

At block 370, audio device 115 progresses to the next channel, thus continuing the search. The method then returns to block 360.

At block 380, audio device 115 performs the selected item. The method then advances to block 390 where it returns to user control.

Figure 4:
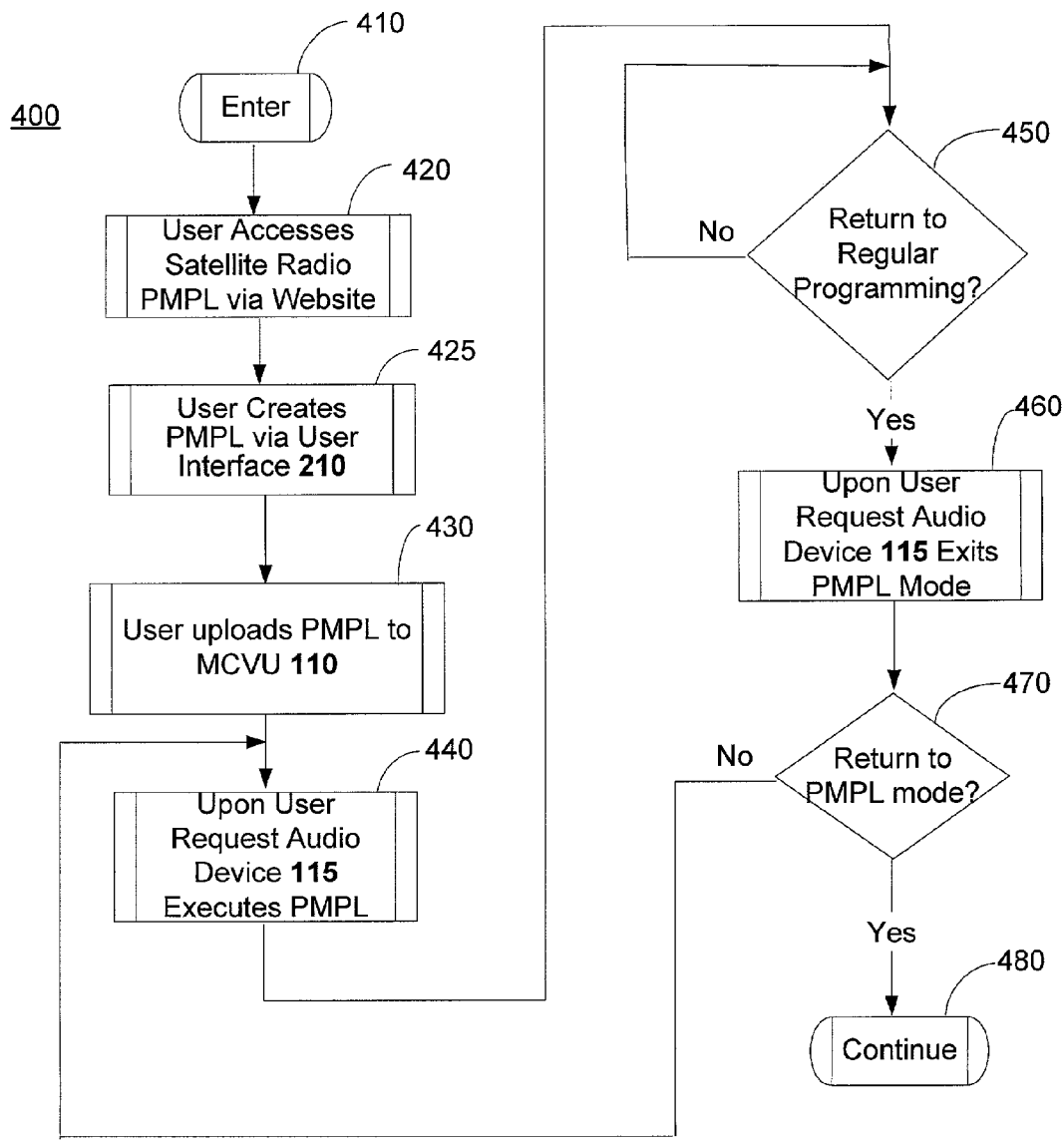
FIG. 4 is a block diagram depicting another exemplary embodiment of code on a computer readable medium in accordance with the present invention.

FIG. 4 is a block diagram depicting another exemplary embodiment of code, referred to as a program, on a computer readable medium in accordance with the present invention. FIG. 4 blocks function like similarly described FIG. 3 blocks. FIG. 4 details an embodiment of a method 400 for setting and receiving user preference satellite radio music selections in a mobile vehicle, in accordance with the present invention. Method 400 may utilize one or more systems detailed in FIGS. 1 and 2 above.

Method 400 begins at block 410 where a user may determine a need to create and utilize either a preferred or a non-preferred personal music programming list (PMPL). In one embodiment, the PMPL may be implemented in a user preference satellite reception system (UPSRS) and referenced as a vehicle preference selection list (VPSL). Method 400 then advances to the next block.

At block 420, the user accesses a satellite radio play list via a website. In one embodiment, this may be accomplished as in block 320 of FIG. 3. The method then advances to block 425. At block 425, the user creates a personal music programming list (PMPL). In one embodiment, this may be accomplished as in block 320 of FIG. 3. The method then advances to block 430.

At block 430, the user uploads the PMPL to the vehicle. In one embodiment, this may be accomplished as in block 330 of FIG. 3. The method then advances to block 440. At block 440, the audio device 115 executes the user's PMPL upon the user request and enters PMPL mode. The user may deliver the instruction by several different methods including touch, verbal, and the like. In one embodiment, the audio device 115 may execute the user's instruction by performing blocks 340 thru 380 of FIG. 3. The method then advances to decision block 450.

At decision block 450, the audio device 115 determines if the user requires the method to exit PMPL mode and return to regular programming. If the user instructs the program to exit PMPL mode the method advances to block 460. If the user does not instruct the program to exit PMPL mode, the method advances to decision block 450.

At block 460, audio device 115 receives instruction from the user and exits PMPL mode, returning to regular programming. The user may deliver the instruction by several different methods including touch, verbal, and the like. The method advances to decision block 470.

At decision block 470, audio device 115 determines if the user requires the method to reenter PMPL mode or return to regular programming. If the user instructs the program to enter PMPL mode the method advances to block 440. If the user does not instruct the program to enter PMPL mode, the method advances to block 480 and returns to regular programming.

The above-described methods and implementation for setting user preference satellite radio music selections in a mobile vehicle are example methods and implementations. These methods and implementations illustrate one possible approach for setting user preference satellite radio music selections in a mobile vehicle. The actual implementation may vary from the method discussed. Moreover, various other improvements and modifications to this invention may occur to those skilled in the art, and those improvements and modifications will fall within the scope of this invention as set forth in the claims below.

The present invention may be embodied in other specific forms without departing from its spirit or essential characteristics. The described embodiments are to be considered in all respects only as illustrative and not restrictive.

We claim:

1. A method for setting user preference satellite radio music selections in a mobile vehicle, the method comprising:

creating at least one vehicle preference selection list utilizing a user interface, wherein the vehicle preference selection list comprises a listing of specific items of broadcast content;

transferring the vehicle preference selection list into a mobile communication unit;

monitoring a satellite radio system broadcast;

requesting the vehicle preference selection list from the mobile communication unit; and extracting a selection from the broadcast based on the vehicle preference selection list.

2. The method of claim 1 wherein extracting the selection comprises comparing user prioritized music selections in the vehicle preference selection list to a plurality of radio station music selections from the broadcast.

3. The method of claim 2 wherein comparing user prioritized music selections comprises sequentially comparing user prioritized music selections in the vehicle preference selection list to a plurality of radio station music selections from the broadcast.

4. The method of claim 1 further comprising:
switching between the vehicle preference selection list and a user defined radio station preference setting in response to user input.

5. The method of claim 1 wherein creating the at least one vehicle preference selection list utilizing the user interface comprises a user communicating with a provider of the broadcast over an internet connection.

6. The method of claim 1 wherein transferring the vehicle preference selection list comprises utilizing a wireless connection.

7. The method of claim 1 wherein transferring the vehicle preference selection list comprises utilizing a physical memory device.

8. A system for vehicle preference selection monitoring comprising;
means for creating a vehicle preference selection list utilizing a user interface, wherein the vehicle preference selection list comprises a listing of specific items of broadcast content;

means for transferring the vehicle preference selection list into a mobile communication unit;

means for monitoring a satellite radio system broadcast;

means for requesting the vehicle preference selection list from the mobile communication unit; and means for extracting a selection from the broadcast based on the vehicle preference selection list.

9. The system of claim 8 wherein means for extracting the selection comprises means for comparing user prioritized music selections in the vehicle preference selection list to a plurality of radio station music selections from the broadcast.

10. The system of claim 9 wherein means for comparing user prioritized music selections comprises means for sequentially comparing user prioritized music selections in the vehicle preference selection list to a plurality of radio station music selections from the broadcast.

11. The system of claim 8 further comprising:
means for switching between the vehicle preference selection list and a user defined radio station preference setting in response to user input.

12. A computer readable medium storing a computer program comprising:
computer readable code for creating a vehicle preference selection list utilizing a user interface, wherein the vehicle preference selection list comprises a listing of specific items of broadcast content;

computer readable code for transferring the vehicle preference selection list into a mobile communication unit;

computer readable code for monitoring a satellite radio system broadcast;

computer readable code for requesting the vehicle preference selection list from the mobile communication unit; and computer readable code for extracting a selection from the broadcast based on the vehicle preference selection list.

13. The computer readable medium of claim 12 wherein extracting the selection comprises computer readable code for comparing user prioritized music selections in the vehicle preference selection list to a plurality of radio station music selections from the broadcast.

14. The computer readable medium of claim 13 wherein comparing user prioritized music selections comprises computer readable code for sequentially comparing user prioritized music selections in the vehicle preference selection list to a plurality of radio station music selections from the broadcast.

15. The computer readable medium of claim 12 further comprising:
computer readable code for switching between the vehicle preference selection list and a user defined radio station preference setting in response to user input.

16. The computer readable medium of claim 12 wherein creating the at least one vehicle preference selection list utilizing the user interface comprises computer readable code for a user communicating with a provider of the broadcast over an internet connection.

17. The computer readable medium of claim 12 wherein transferring the vehicle preference selection list comprises computer readable code for utilizing a wireless connection.

18. The computer readable medium of claim 12 wherein transferring the vehicle preference selection list comprises computer readable code for utilizing a physical memory device.

19. The method of claim 1 wherein monitoring a satellite radio system broadcast comprises monitoring for data identifying the next item in a broadcast.

20. The medium of claim 12 wherein monitoring a satellite radio system broadcast comprises monitoring for data identifying the next item in a broadcast.

* * * * *